United States Patent
Hayashi et al.

(10) Patent No.: US 6,365,531 B1
(45) Date of Patent: Apr. 2, 2002

(54) CLEANING AND DRYING METHOD AND APPARATUS FOR MANUFACTURING SEMICONDUCTOR DEVICES

(75) Inventors: Takayuki Hayashi; Toshihide Okatsu, both of Osaka (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/526,047

(22) Filed: Mar. 15, 2000

(30) Foreign Application Priority Data

Jun. 2, 1999 (JP) .......................................... 11-154971
Nov. 24, 1999 (JP) .......................................... 11-333349

(51) Int. Cl.[7] .............................................. H01L 21/76
(52) U.S. Cl. ....................... 438/906; 438/906; 438/907; 134/94.1; 134/95.1; 134/95.2; 134/95.3
(58) Field of Search ................................. 438/758, 761, 438/906, 907; 427/74, 327, 328, 578, 579; 134/1, 3, 15, 26, 94.1, 95.1, 95.2, 95.3; 136/244, 258

(56) References Cited

U.S. PATENT DOCUMENTS

| 5,253,663 A | 10/1993 | Tanaka et al. ............. 134/95.2 |
|---|---|---|
| 5,762,749 A | 6/1998 | Suzuki et al. ............... 156/345 |
| 5,894,853 A * | 4/1999 | Fujisaki et al. ............... 134/26 |
| 6,132,817 A * | 12/2000 | Tokutate et al. ............ 427/578 |

FOREIGN PATENT DOCUMENTS

| EP | 0661761 | 7/1995 |
| WO | 89/10803 | 11/1989 |

OTHER PUBLICATIONS

Werner A.M., Examiner/Application No. 00 105 305.7/ Official Office Action—Jul. 31, 2001, EPO.

* cited by examiner

Primary Examiner—Charles Bowers
Assistant Examiner—Asok Kumar Sarkar
(74) Attorney, Agent, or Firm—Hogan & Hartson, L.L.P.

(57) ABSTRACT

An apparatus for manufacturing a semiconductor device by forming a thin film on a substrate, comprises a cleaning process section for cleaning the substrate using a cleaning solution and a drying process section for jetting compressed gas onto the cleaned substrate, thereby removing the cleaning solution on the substrate, wherein the cleaning process section includes a nozzle body for jetting the cleaning solution onto the substrate under high pressure.

18 Claims, 8 Drawing Sheets

CLEANING AND DRYING METHOD AND APPARATUS FOR MANUFACTURING SEMICONDUCTOR DEVICES

CROSS-REFERENCE TO RELATED APPLICATIONS

This application is based upon and claims the benefit of priority from the prior Japanese Patent Applications No. 11-154971, filed Jun. 2, 1999; and No. 11-333349, filed Nov. 24, 1999, the entire contents of which are incorporated herein by reference.

BACKGROUND OF THE INVENTION

This invention relates to a method and an apparatus for manufacturing a semiconductor device such as a photovoltaic panel created by forming a thin film on a substrate. When manufacturing a photovoltaic panel of a thin film type, a semiconductor film is formed on a substrate made of, for example, glass and provided with a first electrode that is formed of a transparent conductive film, and then a second electrode formed of a metallic film is formed on the semiconductor film.

When forming a thin film such as a semiconductor film or a metallic film on a substrate, a defect may occur if dust particles are attached to the substrate. In particular, in the case of a photovoltaic panel of a thin film type, a semiconductor film is formed on the entire surface of a substrate, then the resultant structure is divided into a plurality of cells by forming grooves therein, and a metallic film is formed on the upper surfaces of the cells of the semiconductor film. Accordingly, it is highly possible that particles of scraps or burrs generated when forming the grooves will enter the metallic film and cause a defect.

To avoid this, at the time of forming a thin film such as a semiconductor film or a metallic film, such particles are removed to prevent a defect from occurring due to remaining particles.

In the prior art, brush cleaning or ultrasonic cleaning is executed to clean substrates. Although a sufficient cleaning effect cannot be attained from brush cleaning, it can be attained if brush cleaning and ultrasonic cleaning are combined. In the case of ultrasonic cleaning, uniform cleaning cannot be executed unless a cleaning solution is uniformly distributed over the to-be-cleaned surface of a substrate, since in ultrasonic cleaning, the substrate is cleaned by a cleaning solution subjected to ultrasonic oscillation.

Actually, however, in ultrasonic cleaning, a cleaning solution under ultrasonic oscillation is jetted onto a substrate by a shower nozzle, or a substrate is moved in a cleaning solution in a cleaning vessel while ultrasonic oscillation is imparted to the cleaning solution.

In the first-mentioned case, it is hard to uniformly distribute the cleaning solution jetted from the shower nozzle on the to-be-cleaned surface of the substrate. On the other hand, in the second-mentioned case, the substrate is usually moved with its to-be-cleaned surface directed upward, and hence it is also hard to uniformly distribute the cleaning solution on the surface of the substrate. Thus, execution of uniform cleaning is difficult.

In addition, in brush cleaning or ultrasonic cleaning, it is difficult to completely remove burrs formed at, for example, edges of the grooves in a semiconductor film.

BRIEF SUMMARY OF THE INVENTION

It is the object of the invention to provide a method and an apparatus for manufacturing a semi-conductor device, in which a substrate can be reliably and uniformly cleaned so that no dust particles will remain thereon.

To attain the object, there is provided a method of manufacturing a semiconductor device by forming a thin film on a substrate, comprising the steps of: cleaning the substrate using a cleaning solution; and drying the cleaned substrate, wherein in the cleaning step, the cleaning solution is jetted under high pressure onto the substrate from a nozzle body.

In the invention, to clean the substrate using a cleaning solution, the solution is jetted thereon under high pressure. Accordingly, even particles that seem difficult to remove from the substrate can be satisfactorily cleared by the high pressure cleaning solution. This means that a film can be formed on the cleaned substrate without any defect. Moreover, since the high pressure cleaning solution can be uniformly jetted onto the substrate, the substrate can be uniformly cleaned.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the invention will be described with reference to the accompanying drawings.

Figure 1:
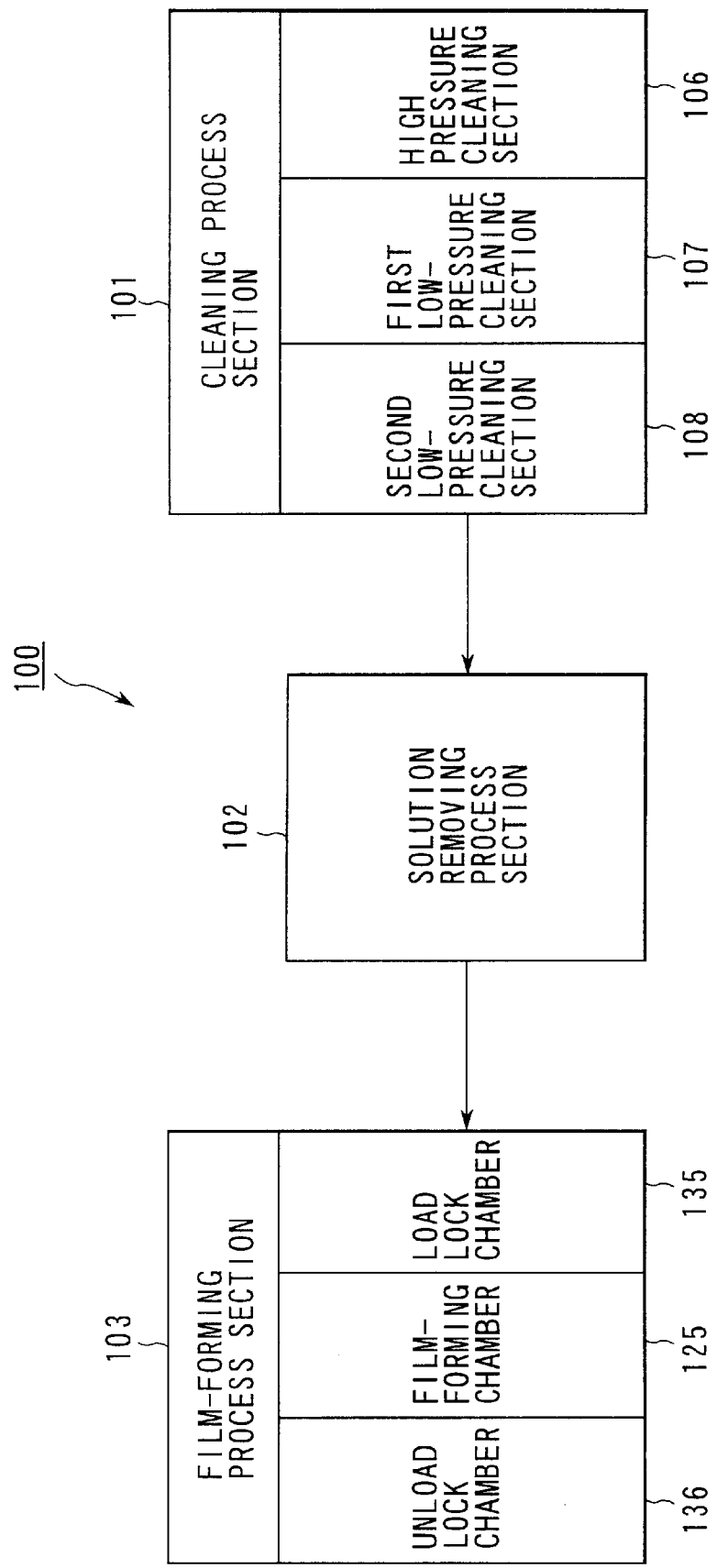
FIG. 1 is a view useful in explaining the entire structure of an apparatus for manufacturing semiconductor devices, according to a first embodiment of the invention.

FIG. 1 shows an apparatus 100 for manufacturing semiconductor devices according to a first embodiment of the invention. The apparatus 100 comprises a cleaning process section 101, a solution removing process section 102 as a drying process section and a film forming process section 103.

Figure 6:
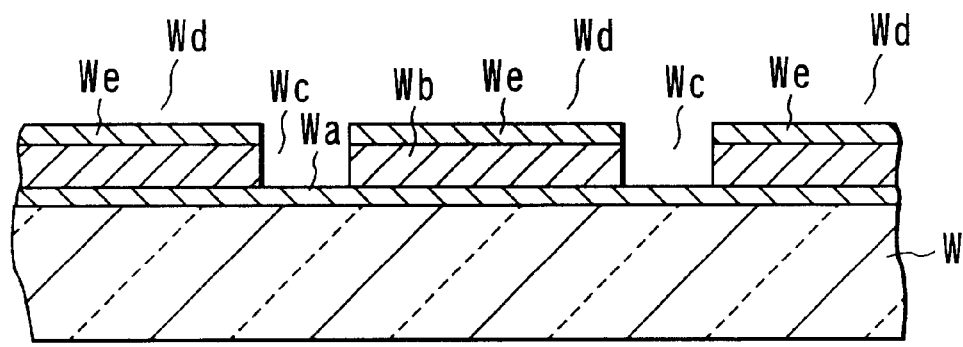
FIG. 6 is a partly enlarged sectional view of a photovoltaic panel incorporated in the manufacturing apparatus.

As shown in FIG. 6, the cleaning process section 101 cleans a glass substrate W provided in advance with a transparent conductive film Wa as an electrode film.

The substrate W is used to form a photovoltaic panel of a thin film type as a semiconductor device, and a semiconductor film Wb is formed, in the film forming process section 103, on that surface (this surface is referred to as an upper surface) of the substrate W on which the transparent conductive film Wa is provided in advance. After the semiconductor film Wb is divided into a plurality of cells Wd by forming separation grooves Wc, a metallic film We is provided as an electrode film on the upper surfaces of the cells. The semiconductor film Wb and the metallic film We are thin films in the present invention.

After the substrate W is cleaned in the cleaning process section 101 before forming the semiconductor film Wb or the metallic film We, it is dried in the solution removing process section 102.

Figure 2:
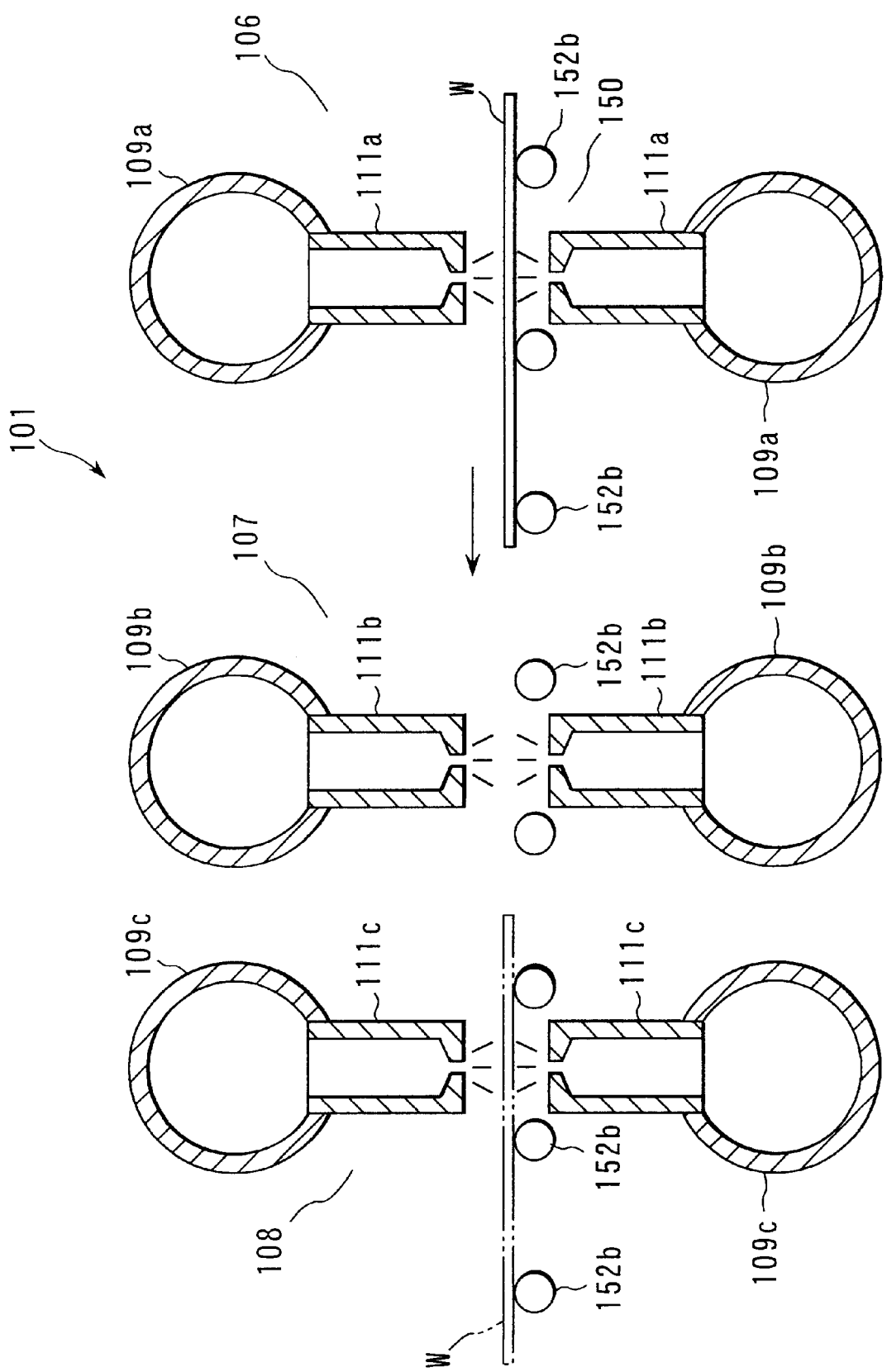
FIG. 2 is a schematic view illustrating a cleaning process section incorporated in the manufacturing apparatus of FIG. 1.
Figure 4A:
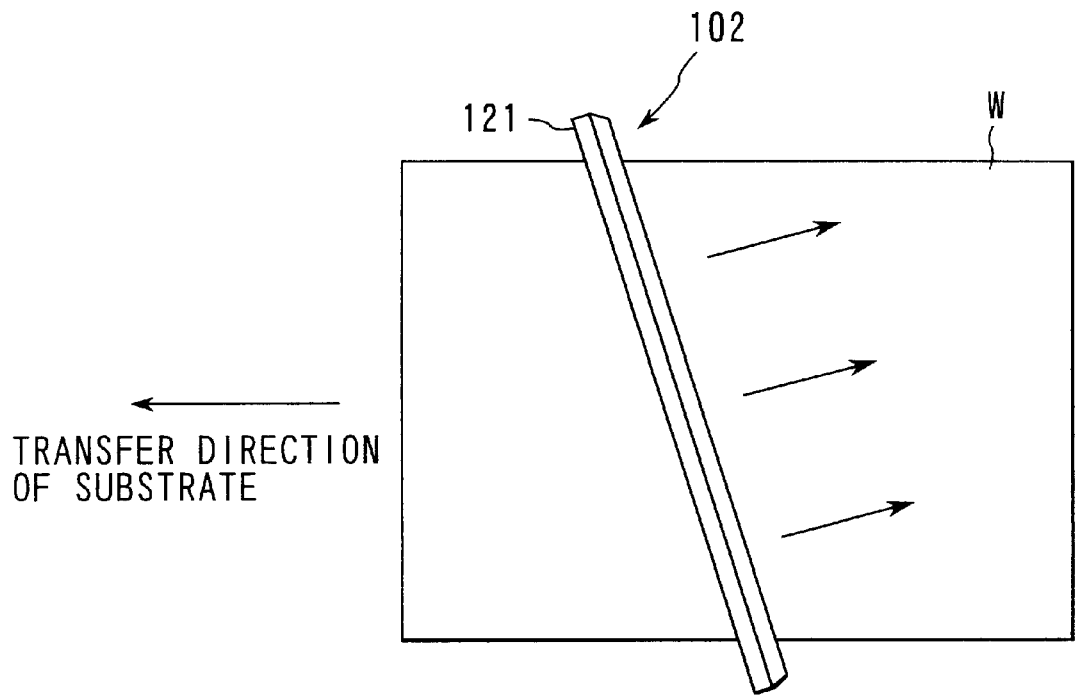
FIG. 4A a plan view showing a solution removing process section incorporated in the manufacturing apparatus.
Figure 4B:
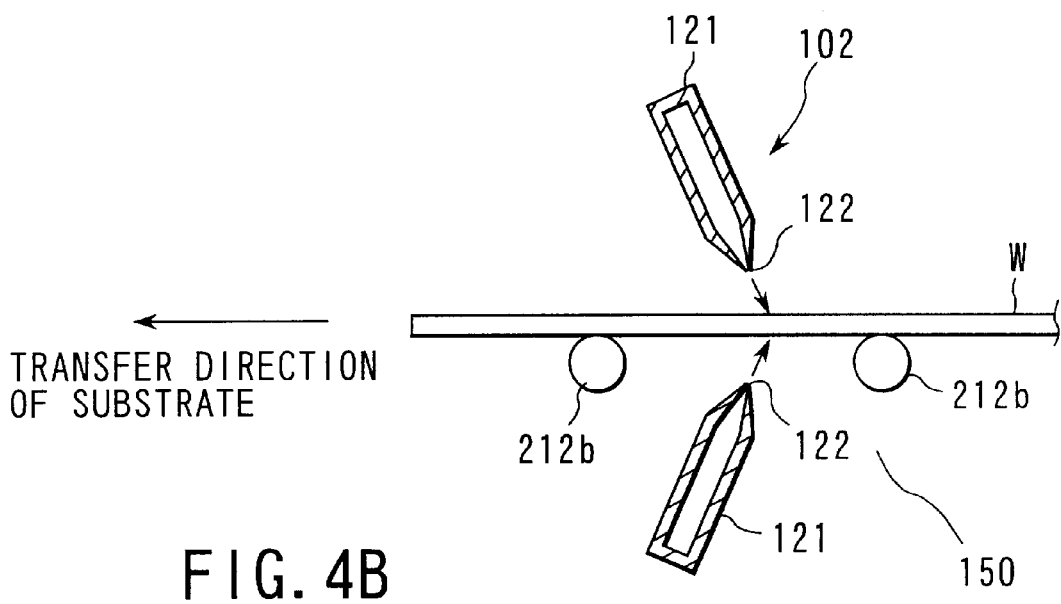
FIG. 4B is a side view of the solution removing process section.

As shown in FIGS. 2 and 4B, a transfer mechanism 150 is provided in the cleaning process section 101 and the solution removing process section 102. The substrate W is transferred by the transfer mechanism 150 from the cleaning process section 101 to the solution removing process section 102.

Figure 8:
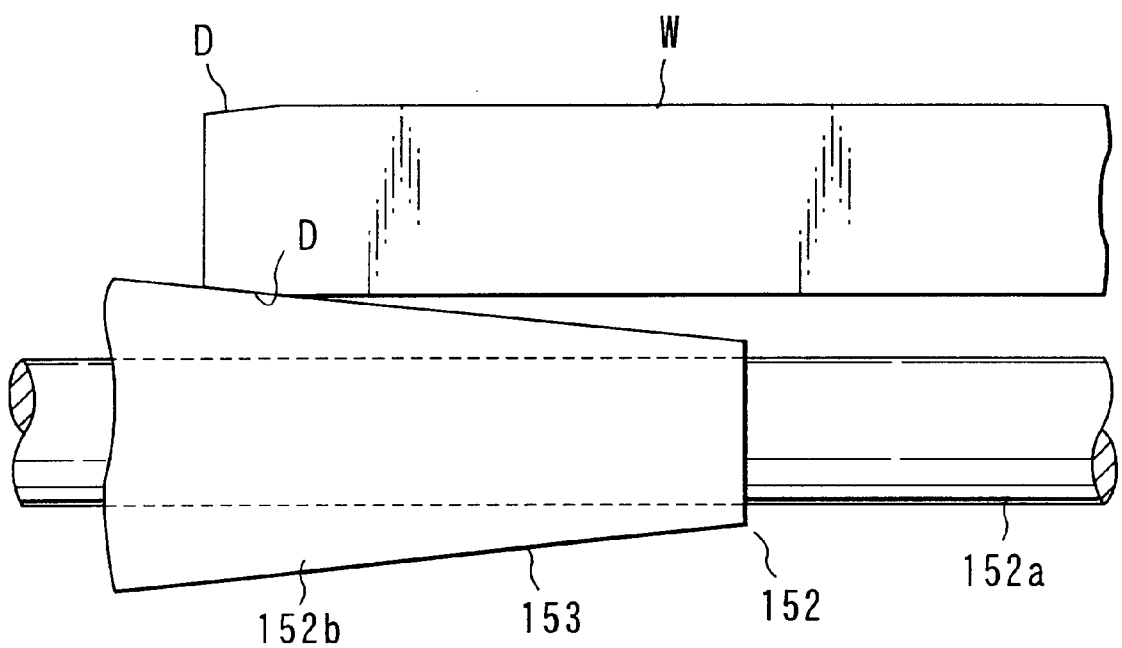
FIG. 8 is an enlarged view of a contact portion between a voltaic substrate and a roller section of a transfer roller incorporated in the transfer mechanism.
Figure 7:
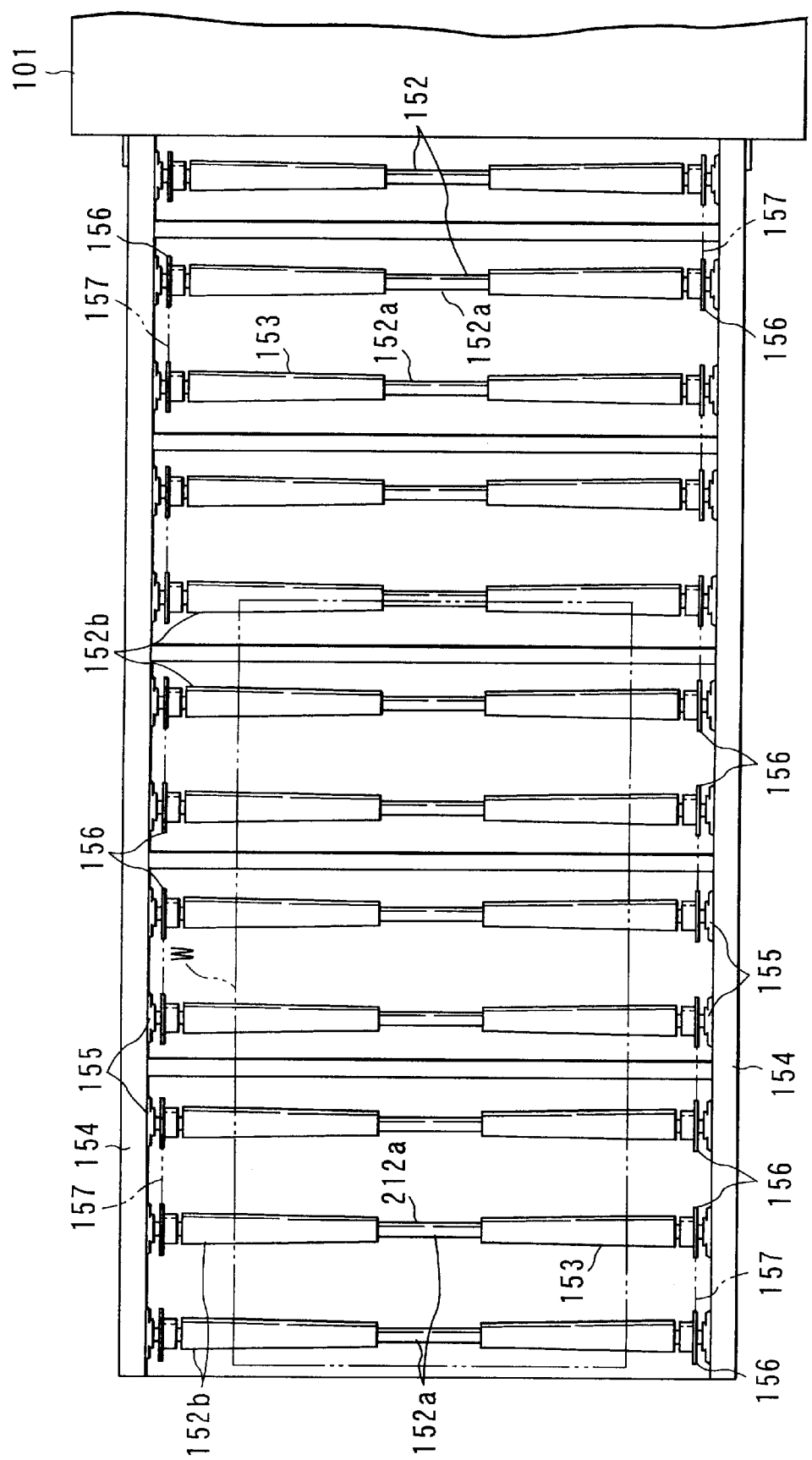
FIG. 7 is a plan view illustrating a transfer mechanism provided in a carry-out process section incorporated in the cleaning process section.

The transfer mechanism 150 has a plurality of transfer rollers 152 arranged at regular intervals in the transfer direction of the substrate W. As shown in FIGS. 7 and 8, each transfer roller 152 has a rotary shaft 152a, and a pair of roller sections 152b provided on respective opposite sides of the rotary shaft 152a except for an axial central portion thereof. Each of the roller sections 152b has a tapered outer peripheral surface 153. In other words, each roller section 152b is tapered such that its outer diameter gradually reduces from the axial end of the rotary shaft 152a to an axially inward portion of the shaft 152a.

On the other hand, the substrate W has chamfered portions D at the edges of the upper and lower surfaces, as shown in FIG. 8. The chamfered portions D have substantially the same angle as the tapered surface 153. Since the chamfered portions D are kept in stable line contact with the tapered surface 153 of each transfer roller 152 while the substrate W is transferred, the substrate W is prevented from moving in an axially zigzag manner. As a result, the substrate W is transferred with its surfaces kept horizontal and hence can be uniformly cleaned. If, for example, the substrate W inclines in its width direction, the distance between a nozzle body 111a–111c (which will be described later) and one width-directional end of the substrate W differs from that between another nozzle body 111a–111c and the other width-directional end, thereby making it difficult to execute uniform cleaning of the substrate W.

Moreover, since only edge portions of the substrate W contact the tapered surfaces 153 while the substrate W is transferred by the transfer rollers 152, the contact area between the substrate W and each transfer roller 152 is significantly reduced. In particular, when forming an electrode layer or a semiconductor layer on the substrate W, or when transferring the substrate W with its film-formed surface directed downward, the film-formed surface is prevented from being contaminated by dust or a component, such as rubber, of each transfer roller 152.

If the inclination angle of the chamfered portions D is not identical to that of the tapered surfaces 153, the stability of transfer will reduce. Further, if the substrate W has no chamfered portions, its corners contact each transfer roller 152 at right angles. Accordingly, the transfer rollers 152 may easily be damaged. To avoid this, the corners of the substrate W are chamfered so that the inclination angle of the chamfered portions D will be identical to that of the tapered surfaces 153. Thus, the substrate W has corners of an obtuse angle and therefore will not easily damage the transfer rollers 152.

The tapered surfaces 153 of the roller sections 152b of each transfer roller 152 in the transfer mechanism 150 enable the omission of guide members provided in the prior art at the width-directional opposite ends of the substrate W to limit zigzag movement of the substrate W. This structure prevents a cutout from occurring in width-directional opposite end portions of the substrate W as in the prior art using the guide members for preventing zigzag movement of the substrate W. Moreover, this structure enables reduction of the number of required component parts as compared with the prior art using the guide members.

In each transfer roller 152, the roller sections 152b are separate from the rotary shaft 152a. Specifically, each roller section 152b is fitted on the rotary shaft 152, and consists of a cylindrical member that is made of a synthetic resin such as a fluororesin having a high heat resistance and chemical resistance, and has the tapered surface 153 axially inclined. Accordingly, when each roller section 152b is worn out after use, it can be easily exchanged for a new one at low cost. Further, the tapered surface 153 can be easily formed since the roller section 152b can be handled independent of the rotary shaft 152a.

As is shown in FIG. 7, the axial opposite ends of each rotary shaft 152a are rotatably supported, via bearings 155, by a pair of support members 154 provided in the shape of a channel at the width-directional opposite ends of the apparatus main body.

Sprockets 156 are provided at the opposite ends of each rotary shaft 152a. The two adjacent sprockets 156 of each pair of adjacent rotary shafts 152a are connected by a chain 157. As shown in FIG. 7, different pairs of rotary shafts 152a are connected by respective chains 157 at the axially opposite sides of the rotary shafts 152a.

The sprocket 156 provided at the rightmost or leftmost transfer roller 152 is driven by a driving source (not shown). Accordingly, while the driving source rotates, its rotation is transmitted to all the transfer rollers 152 in the cleaning process section 101 via the chains 157. In other words, the transfer rollers 152 in the cleaning process section 101 can be rotated by the driving source.

The transfer rollers 152 in the solution removing process section 102 are rotated by the same structure as that employed in the cleaning process section 101. Thus, the transfer rollers 152 in the cleaning process section 101 are controlled by a control unit so that they will rotate in synchronism with the transfer rollers in the solution removing process section 102. As a result, the substrate W is smoothly transferred from the inlet of the cleaning process section 101 to the inlet of the film-forming process section 103.

In the cleaning process section 101, a high-pressure cleaning section 106, a first low-pressure cleaning section 107 and a second low-pressure cleaning section 108 are arranged in this order along the transfer direction of the substrate W, as is shown in FIGS. 1 and 2.

Figure 3A:
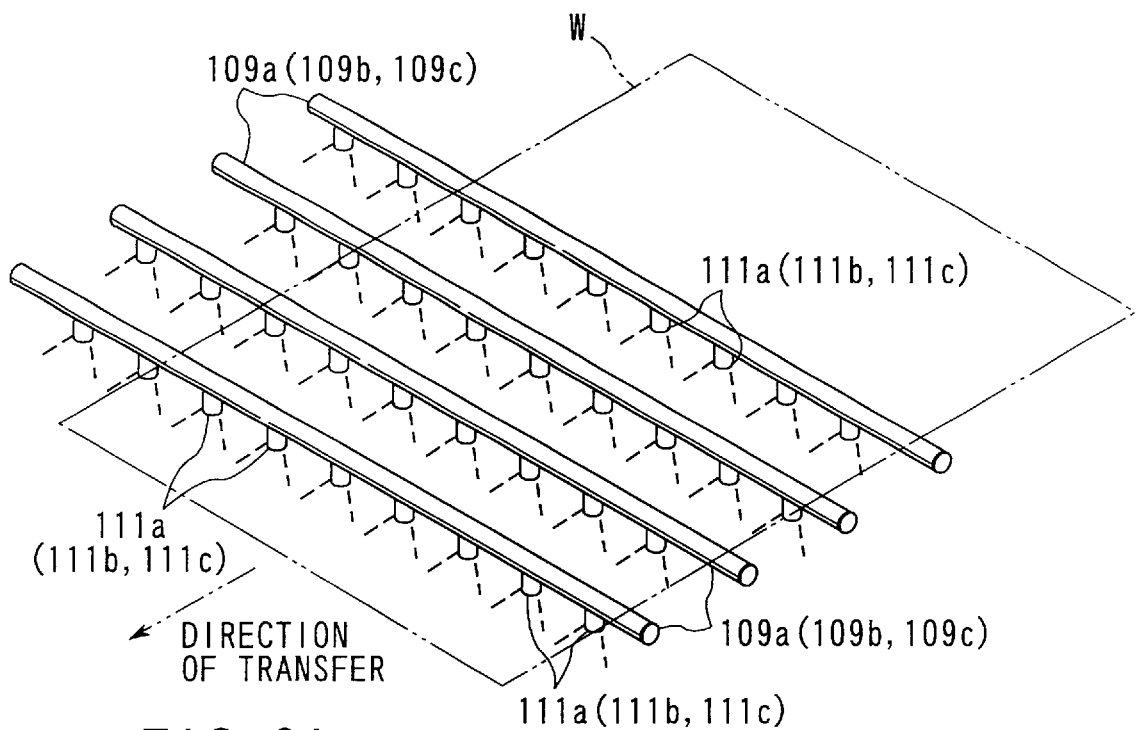
FIG. 3A is a view useful in explaining arrangement of nozzle bodies over a substrate in the cleaning process section.

Each cleaning section 106, 107 or 108 includes a plurality of header tubes, four header tubes 109a, 109b or 109c in this embodiment as shown in FIG. 3A, which are opposed to the upper and lower surfaces of the substrate W and arranged at regular intervals along the transfer direction of the substrate W, and longer than the width of the substrate W. Each header tube has a plurality of nozzle bodies 111a, 111b or 111c opposed to the upper and lower surfaces of the substrate W.

Although FIG. 2 shows only one header tube 109a, 109b or 109c in each cleaning section 105, 106 or 107, four header tubes are provided in each cleaning section as aforementioned with reference to FIG. 3A. The number of the header tubes is not limited to four, but may be changed to any desired number in accordance with, for example, the transfer rate of the substrate W.

The nozzle bodies 111a–111c are of a flat-spray type with a jet angle of 60° in this embodiment. Supposing that the jet area of each nozzle body is S, the interval between adjacent nozzle bodies along the axis of each header tube is set so that the jet areas S of adjacent nozzle bodies will not be separate from each other as shown in FIG. 3B.

Moreover, adjacent header tubes 109a–109c in the transfer direction of the substrate W are displaced from each other in the width direction of the substrate W by ½ the interval between adjacent nozzle bodies along the axis of each header tube.

Figure 3B:
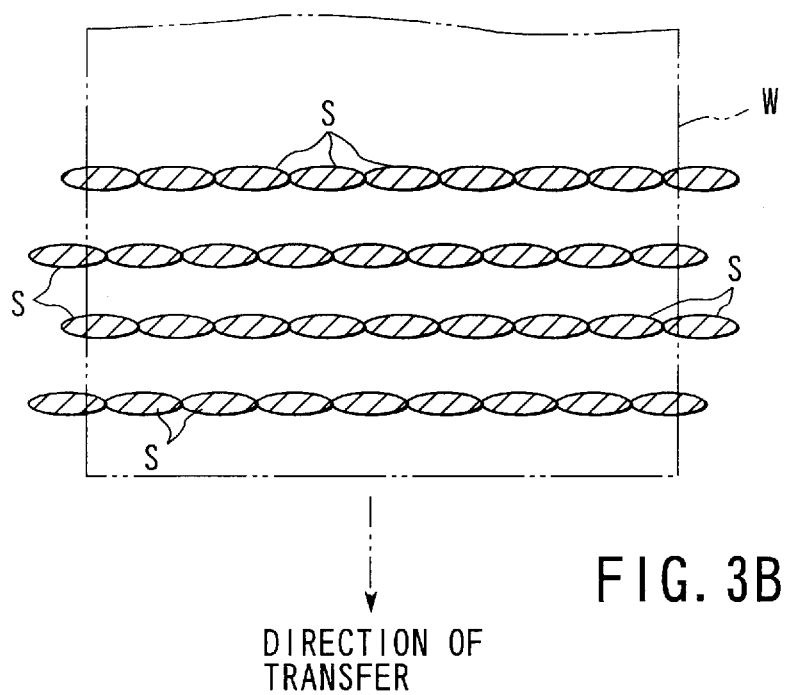
FIG. 3B is a view useful in explaining distribution of a cleaning solution jetted from each nozzle body onto the substrate.

Thus, the areas of a cleaning solution jetted from the nozzle bodies 111a–111c are arranged in a zigzag manner as shown in FIG. 3B, i.e. the areas corresponding to the nozzle bodies arranged adjacent in the transfer direction of the substrate W are displaced from each other in the width direction of the substrate W. Accordingly, the substrate W can be cleaned uniformly over the entire width thereof.

Further, each header tube 109a–109c is arranged such that the nozzle bodies 111a–111c are opposed to the surface of the substrate W with a space of 2–12 cm interposed therebetween.

The header tube 109a of the high-pressure cleaning section 106 is supplied with a highly pressurized cleaning solution such as pure water or water containing a detergent. Specifically, in this embodiment, the cleaning solution is supplied under a pressure of 10 kg/cm$^2$–26 kg/cm$^2$.

When the nozzle bodies 111a were opposed to a substrate W having a burred semiconductor film Wb with a space of 2 cm interposed therebetween, and a cleaning solution was jetted from the nozzle bodies 111a onto the substrate W under a pressure of 10 kg/cm$^2$, the burred portion of the semiconductor film Wb was partially removed. However, under a pressure of less than 10 kg/cm$^2$, almost no burred portion could be removed.

On the other hand, when the nozzle bodies 111a were opposed to the substrate W with a space of 10 cm interposed therebetween, and the cleaning solution was jetted from the nozzle bodies 111a onto the substrate W under a pressure of 26 kg/cm$^2$, not only the burred portion but also part of the semiconductor film Wb itself were removed.

In light of the above experiments, in order to remove burrs, it was confirmed preferable that the pressure of the cleaning solution to be supplied to the nozzle bodies 111a of the high pressure cleaning section 106 is set at 10 kg/cm$^2$–26 kg/cm$^2$.

The first low-pressure cleaning section 107 is arranged to be supplied with a cleaning solution of a pressure lower than that supplied into the high-pressure cleaning section. This washes away dust particles left on the substrate W in the high-pressure cleaning section 106.

The second low-pressure cleaning section 108 is arranged to clean the substrate W using a cleaning solution of substantially the same pressure as the cleaning solution used in the first low-pressure cleaning section 107. However, pure water of a higher purity is used in this section than in the first low-pressure cleaning section 107. The use of pure water of a high purity enables further cleaning of the substrate W already cleaned in the first low-pressure cleaning section 107.

The substrate W cleaned in the second low-pressure cleaning section 108 is dried in the solution removing process section 102. As shown in FIGS. 4A and 4B, a pair of air knives 121 is provided in the solution removing process section 102 such that they are opposed to the upper and lower surfaces of the substrate W transferred therein. The air knives 121 are supplied with clean compressed gas such as compressed air filtered through an ulpa filter. The blowing velocity of the compressed air is set at about 10 m/sec.

The air knives 121 have a length longer than the width of the substrate W, and have respective slits 122 formed at ends thereof opposed to the upper and lower surfaces of the substrate W, and extending over their entire length, as is shown in FIGS. 4A and 4B.

The air knives 121 are inclined at a predetermined angle to a reference horizontal direction that is perpendicular to the transfer direction of the substrate W. Further, the slits 122 are inclined in the transfer direction with respect to the vertical direction.

The compressed air supplied to the air knives 121 is jetted onto the upper and lower surfaces of the substrate W. As a result, the cleaning solution on the upper and lower surfaces of the substrate W is pushed toward that portion of the substrate W which is located upstream in the transfer direction of the substrate W and at a width-directional one side of the same as shown in FIG. 4A. The pushed solution is then smoothly removed from the one side.

The compressed air to be supplied to the air knives 121 is heated to a temperature higher than the room temperature, e.g. about 40–100° C. Accordingly, the cleaning solution on the substrate W is not only removed by the compressed air but also dried by the heat of the compressed air. Thus, the solution removal process can be executed effectively and reliably.

Without heating the compressed air, the substrate W can be dried to attain a predetermined state. Further, if ionized compressed air is jetted onto the substrate W, the substrate W can be simultaneously dried and cleaned.

The substrate W dried in the solution removing process section 102 is immediately transferred to the film forming process section 103. Specifically, after the substrate W is processed in the solution removing process section 102 and carried out of it by the transfer rollers 152, it is transferred to the film-forming process section 103 by a robot (not shown).

Since the substrate W dried in the solution removing process section 102 is immediately transferred to the film-forming process section 103, there is few occasion of attachment of dust particles in the air to the dried substrate W. Therefore, the substrate W in a clean state can be supplied to the film-forming process section 103.

In addition, since unlike the prior art, the substrate W is not dried in a clean oven but is dried using compressed air, the drying process can be executed immediately after the cleaning process.

This means that unlike the case of drying washed substrates W by batch processing, little time is required for cleaning and drying them, and hence that the cleaning solution on each substrate W during cleaning is prevented from partially drying before the drying process and forming a water mark on it.

Figure 5:
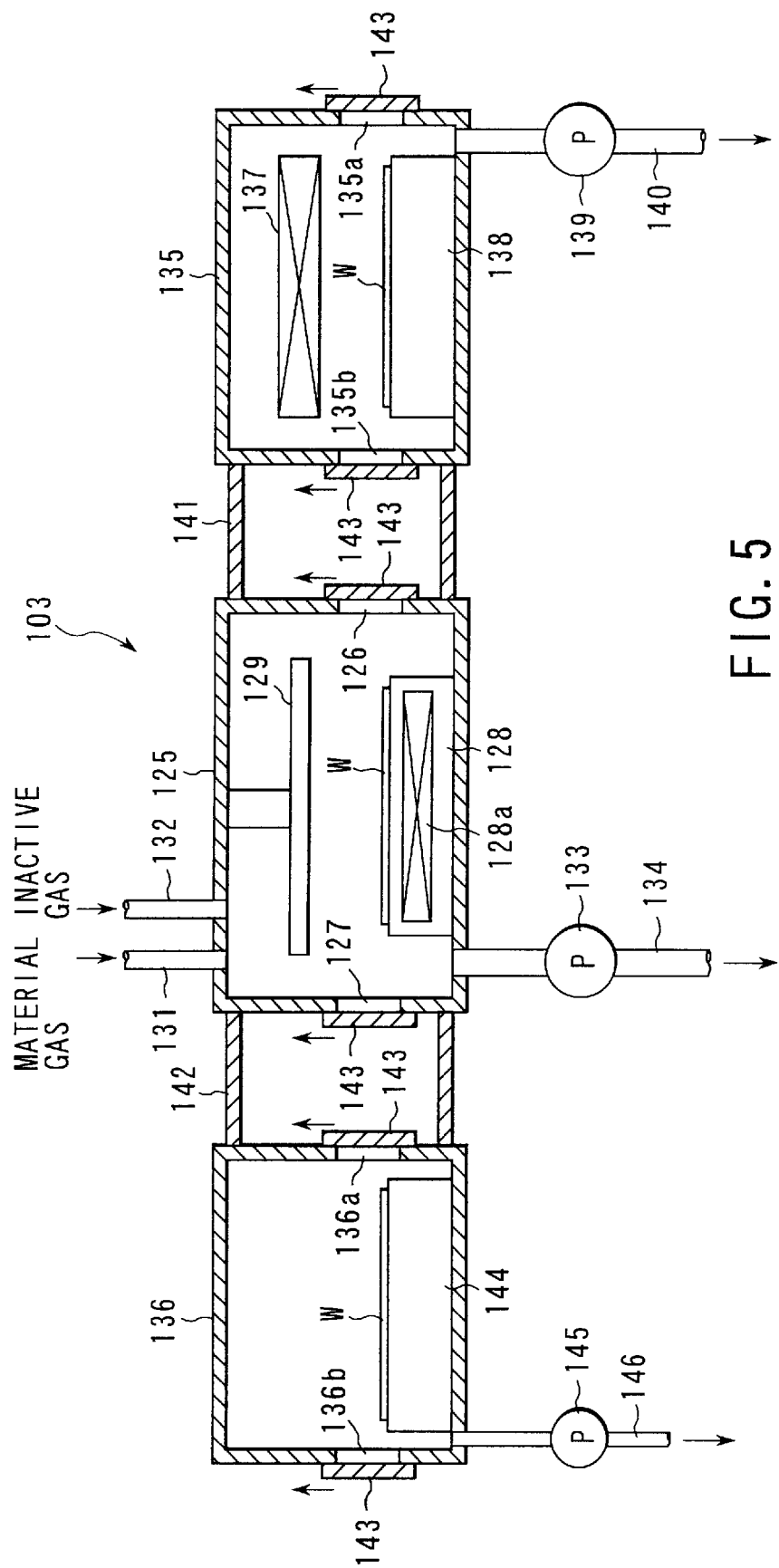
FIG. 5 is a schematic view illustrating a film forming process section incorporated in the manufacturing apparatus.

The film-forming section 103 has a film-forming chamber 125 as shown in FIG. 5. In the film-forming chamber 125, a semiconductor film is formed on the upper surface of each substrate W by plasma CVD. An inlet 126 and an outlet 127 are provided at the opposite sides of the film-forming chamber 125, respectively. Further, the film-forming chamber 125 contains a table 128 with a heater 128a installed therein, and a high-frequency electrode 129 opposed to the upper surface of the table 128.

A first supply pipe 131 for supplying a material gas and a second supply pipe 132 for supplying an inactive gas are connected to upper portions of the film-forming chamber 125. An exhaust pipe 134 having an exhaust pump 133 is connected to a bottom portion of the film-forming chamber 125.

A load lock chamber 135 is provided at the inlet 126 side of the film-forming chamber 125, and an unload lock chamber 136 is provided at the outlet 127 side of it. The chambers 135 and 136 have inlets 135a and 136a and outlets 135b and 136b, respectively.

The load lock chamber 135 contains a pre-heater 137 and a support table 138, and is connected at its bottom to an exhaust pipe 140 having an exhaust pump 139.

The outlet 135b of the load lock chamber 135 is airtightly connected to the inlet 126 of the film-forming chamber 125 by a first connector 141, while the outlet 127 of the film-forming chamber 125 is airtightly connected to the inlet 136a of the unload lock chamber 136 by a second connector 142.

The inlet and outlet of each chamber 125, 135 or 136 are each arranged to be airtightly closed by a corresponding openable/closable shutter 143. Each of the first and second connectors 141 and 142 contains a transfer robot (not shown). The unload lock chamber 136 contains a mount table 144 and is connected at its bottom to an exhaust pipe 146 having an exhaust pump 145.

When the substrate W dried in the solution removing section 102 has been transferred onto the support table 138 in the load lock chamber 135, the inlet 135a is closed, the pressure in the chamber is reduced and the substrate W is pre-heated by the pre-heater 137. During pre-heating, the load lock chamber 135 is decompressed by the exhaust pump 139.

After the substrate W is pre-heated, the outlet 135b of the load lock chamber 135 is opened with the inlet 135a closed, whereby the robot provided in the first connector 141 enters the load lock chamber 135 and receives the substrate W from the support table 138.

Subsequently, the outlet 135b of the load lock chamber 135 is airtightly closed by the shutter 143, and at the same time the inlet 126 of the film-forming chamber 125 is opened. At this time, the robot in the first connector 141 transfers the pre-heated substrate W onto the table 128 in the film-forming chamber 125, and then retreats. Then, the inlet 126 is closed and the chamber 125 is decompressed by the exhaust pump 133.

After the film-forming chamber 125 is decompressed to a predetermined pressure, an inactive gas is supplied therein through the second supply pipe 132, and then a high-frequency power is supplied to the high-frequency electrode 129 to activate the inactive gas. The activated gas further cleans the substrate W cleaned in the cleaning section 101.

After the substrate W is cleaned by the activated gas for a predetermined period, a material gas is supplied from the first supply pipe 131 instead of the inactive gas. The material gas reacts in a plasma created while the high-frequency power is supplied to the high-frequency electrode 129.

Then, solid matter resulting from the reaction deposits on the upper surface of the substrate W. Thus, a semiconductor film is formed on the upper surface of the substrate W.

As described above, the substrate W is cleaned in the cleaning section 101, dried without contamination in the solution removing section 102 and supplied into the film-forming chamber 125.

Accordingly, the semiconductor film Wb provided on the substrate W contains almost no dust particles, and hence has no defects. This means that semiconductor devices can be manufactured at a high yield.

After finishing the film forming of the substrate W, the outlet 127 of the film-forming chamber 125 is opened, and the robot in the second connector 142 enters the chamber to receive the substrate W. At the same time, the inlet 136a of the unload lock chamber 136 is opened.

The robot transfers the film-formed substrate W from the film-forming chamber 125 to the unload lock chamber 136, thereby mounting it onto the mount table 144. Then, the robot retreats into the second connector 142. At the same time, the outlet 127 of the film-forming chamber and the inlet 136a of the unload lock chamber 136 are closed.

Since as described above, the load lock chamber 135 and the unload lock chamber 136 are airtightly connected to the inlet 126 and the outlet 127 of the film-forming chamber 125, respectively, the substrate W can be transferred without greatly changing the decompressed state of the film-forming chamber 125.

The substrate W mounted on the mount table 144 in the unload lock chamber 136 is carried out of the chamber by a robot (not shown) provided outside of the outlet 136b of the chamber 136, and subjected to the next process.

In the next process, the semiconductor film Wb on the substrate W is divided into a plurality of cells Wd by the separation grooves Wc, and the resultant structure is cleaned and dried. After that, a metallic film We is formed on the upper surface of each cell in another film-forming process.

Before forming the metallic film We, the semiconductor film Wb cells are cleaned in the high-pressure cleaning section 106 of the cleaning process section 101. Accordingly, particles of chips or burrs generated when the separation grooves Wc are formed in the semiconductor film Wc are sufficiently removed, and occurrence of a defect due to particles contained in the metallic film We is avoided.

Although in the first embodiment, the substrate W is horizontally transferred and its upper and lower surfaces are cleaned in the cleaning process section 101, the substrate W may be transferred vertically upward, with its to-be-cleaned surface kept substantially vertical.

Since in this case, the cleaning solution jetted onto the to-be-cleaned surface of the substrate W flows rearward in its transfer direction, i.e. flows downward, particles removed from the substrate W can be effecttively washed out. Alternatively, the substrate W may be transferred vertically downward.

If the substrate W is transferred with its to-be-cleaned surface kept vertical, not only in the cleaning process section 101 but also in the solution removing process section 102, the cleaning solution on the substrate W can be effectively removed by compressed air jetted from the air knives 121.

Moreover, in the film-forming process section, a single load lock chamber is provided upstream of the film-forming chamber for pre-heating substrates and keeping the decompressed state of the film-forming chamber. However, a plurality of load lock chambers may be provided in order to enhance the effect of the pre-heating of substrates, or in order to make the time required for the treatments in the cleaning process section and the solution removing process section substantially equal to the time required for the film forming in the film-forming process section, thereby enabling sequential execution of a series of process steps without any waiting time in each process section.

Figure 9:
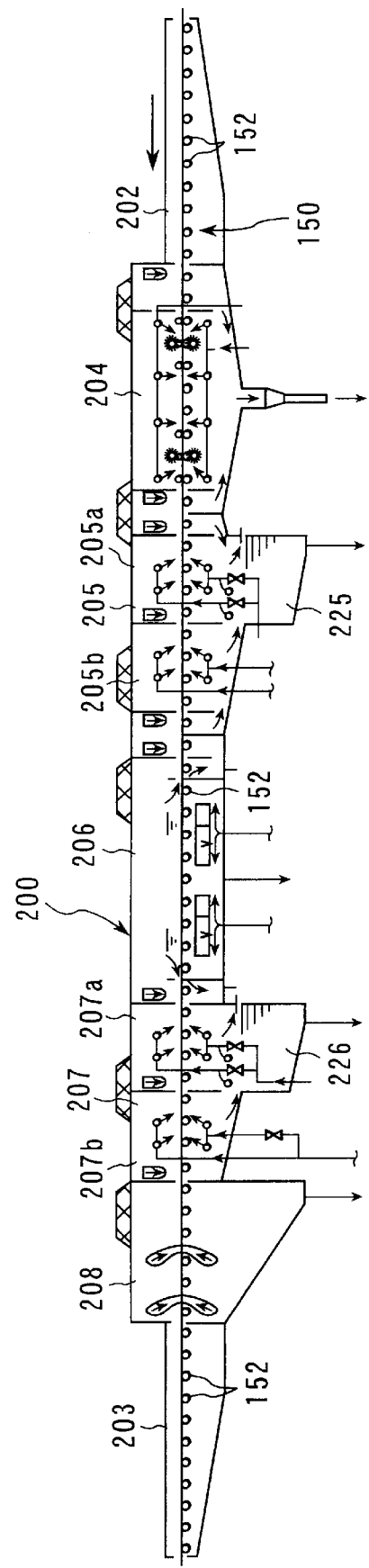
FIG. 9 is a schematic view showing a cleaning device incorporated in a manufacturing apparatus according to a second embodiment of the invention.

FIG. 9 shows a cleaning process unit 200 for cleaning the substrate W. In FIG. 9, elements similar to those in FIG. 7 are denoted by corresponding reference numerals and no detailed description is given thereof. The cleaning process unit 200 includes an inlet section 202 at one side of the transfer direction of the substrate W indicated by the arrow, and an outlet section 203 at the other side. A brush cleaning section 204, a first shower cleaning section 205, an ultrasonic cleaning section 206, a second shower cleaning section 207 and a water removing section 208 are provided in this order from the inlet section 202 side between the inlet section 202 and the outlet section 203.

The cleaning process unit 200 includes a transfer mechanism 150 provided from the inlet section 202 to the outlet section 203 for smoothly transferring the substrate W from the inlet section 202 to the outlet section 203.

The brush cleaning section 204 cleans the upper and lower surfaces of the substrate W transferred from the inlet section 202, using cleaning brushes. The first shower cleaning section 205 washes out, using city water, a detergent used for cleaning in the brush cleaning section 204. The first shower cleaning section is divided into two portions 205a and 205b located upstream and downstream of the substrate W with respect to its transfer direction, respectively. The amount of used city water is saved by storing city water used in the downstream portion 205b, in a reservoir 225 provided in the upstream portion 205a, and reusing the city water stored in the reservoir 225, in the upstream portion 205a.

The ultrasonic cleaning section 206 cleans the substrate W cleaned in the first shower cleaning section 205, using pure water to which ultrasonic oscillation is applied. As a result, the substrate W can be cleaned more elaborately.

The second shower cleaning section 207 cleans, using pure water in a shower, the substrate W subjected to ultrasonic cleaning in the ultrasonic cleaning section 206. The substrate W is further elaborately cleaned by the second shower cleaning section 207. The second shower cleaning section is divided into two portions 207a and 207b located upstream and downstream of the substrate W with respect to its transfer direction, respectively. The upstream portion 207a has a reservoir 226 for storing pure water used in the downstream portion 207b. The pure water stored in the reservoir 226 is reused in the upstream portion 207a of the second shower cleaning section 207.

The substrate W cleaned in the second shower cleaning section 207 is transferred into the water removing section 208, where pure water on the substrate W is dried and removed by jetting compressed air from the air knives onto the upper and lower surfaces of the transferred substrate W.

The substrate W dried by the water removing section 208 is transferred to the outlet section 203, which is the termination of a series of treatments on the substrate W.

The invention is not limited to the above-described embodiments. More specifically, the semiconductor device is not limited to the photovoltaic panel, but may be a liquid crystal display panel or a semiconductor wafer. In summary, the invention is applicable to cases where a semiconductor film is formed on a substrate. Furthermore, the cleaning process section is not limited to a sequential combination of cleaning sections such as a brush cleaning section, a shower cleaning section, a ultrasonic cleaning section, etc. It suffices if the cleaning process section includes at least one of the cleaning sections. It is a matter of course that the transfer mechanism is also applicable to an apparatus other than the cleaning process apparatus. The transfer mechanism is applicable to any apparatus for transferring a substrate in the form of a plate. Moreover, although in the embodiments, the entire upper and lower edges of the substrate W are chamfered, only those portions of the edges of the substrate W which are brought into contact with the tapered surfaces of each transfer roller may be chamfered. In addition, the cleaning process apparatus may employ another type transfer mechanism.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device by forming a thin film on a substrate comprising the steps of:
   cleaning the substrate using a cleaning solution; and
   drying the cleaned substrate,
   wherein in the cleaning step, the cleaning solution is jetted under high pressure onto the substrate from a plurality of nozzle bodies spaced-apart across a width of the substrate.

2. A method according to claim 1, further comprising the step of forming a thin film on the dried substrate.

3. A method according to claim 1, wherein in the cleaning step, the cleaning solution is supplied to the plurality of nozzle bodies under a pressure of 10 kg/cm$^2$–26 kg/cm$^2$, and the distance between each of the plurality of nozzle bodies and the substrate is 2–10 cm.

4. A method according to claim 1, wherein in the cleaning step, the substrate has a to-be-cleaned surface thereof kept substantially vertical.

5. A method according to claim 1, wherein in the drying step, compressed gas is jetted onto the substrate cleaned in the cleaning step, thereby removing the cleaning solution on the substrate.

6. A method according to claim 5, wherein the compressed gas jetted onto the substrate is heated to a predetermined temperature.

7. A method according to claim 1, wherein the substrate is a photovoltaic panel of a thin film type.

8. A method according to claim 1, wherein in the cleaning step, the cleaning solution is jetted under high pressure onto the substrate from a plurality of rows of nozzle bodies extending across the width of the substrate and each row comprised of a plurality of nozzle bodies spaced-apart across the width of the substrate.

9. A method according to claim 1, wherein the cleaning step includes the step of transporting the substrate past the plurality of nozzle bodies on a transfer mechanism.

10. A method according to claim 9, wherein the step of transporting the substrate includes providing a plurality of rotatable elements along a transfer path in engagement with opposite edges of the substrate and rotatably driving the rotatable elements to transport the substrate.

11. A method according to claim 10, wherein the step of transporting the substrate includes providing opposite ends of each of the plurality of rotatable elements with tapered surfaces and providing the opposite edges of the substrate with chamfered portions for engagement with the tapered surfaces at the opposite ends of the plurality of rotatable elements.

12. A method according to claim 5, wherein the drying step comprises jetting compressed gas onto the substrate in a direction forming an acute angle relative to a surface of the substrate.

13. A method according to claim 5, wherein the drying step comprises jetting compressed gas onto the substrate along an axis extending obliquely across the width of the substrate.

14. A method of cleaning a substrate used to manufacture a semiconductor device, comprising:

a first cleaning step of cleaning the substrate by jetting a cleaning solution onto the substrate at a high pressure;

a second cleaning step of cleaning the substrate by jetting a cleaning solution onto the substrate at a low pressure; and a solution removing step of jetting compressed air onto the substrate.

15. A method according to claim 14, further comprising a third cleaning step performed after the second cleaning step and before the solution removing step of cleaning the substrate by jetting a cleaning solution onto the substrate at a low pressure.

16. A method according to claim 15, wherein each of the first, second and third cleaning steps comprises jetting a cleaning solution onto opposite surfaces of the substrate from a plurality of nozzles extending in spaced-apart fashion across a width of the substrate as the substrate is advanced relative to the nozzles.

17. A method according to claim 14, wherein the solution removing step comprises employing a pair of air knives to jet compressed air onto opposite surfaces of the substrate.

18. A method according to claim 14, wherein, after the solution removing step is performed, a further step is performed of forming a thin film on the substrate.

* * * * *